United States Patent
Aota et al.

(10) Patent No.: US 7,426,146 B2
(45) Date of Patent: Sep. 16, 2008

(54) REFERENCE VOLTAGE GENERATING CIRCUIT AND CONSTANT VOLTAGE CIRCUIT

(75) Inventors: Hideyuki Aota, Hyogo (JP); Hirofumi Watanabe, Hyogo (JP)

(73) Assignee: Ricoh Company, Ltd., Tokyo (JP)

( * ) Notice: Subject to any disclaimer, the term of this patent is extended or adjusted under 35 U.S.C. 154(b) by 109 days.

(21) Appl. No.: 11/506,029

(22) Filed: Aug. 16, 2006

(65) Prior Publication Data
US 2007/0047332 A1 Mar. 1, 2007

(30) Foreign Application Priority Data
Aug. 31, 2005 (JP) ............... 2005-252011

(51) Int. Cl.
*G11C 5/14* (2006.01)
(52) U.S. Cl. ............... 365/189.09; 365/211
(58) Field of Classification Search ........... 365/189.09, 365/211; 323/313
See application file for complete search history.

(56) References Cited

U.S. PATENT DOCUMENTS

| | | | | |
|---|---|---|---|---|
| 5,646,516 A * | 7/1997 | Tobita | ............ | 323/313 |
| 6,617,835 B2 * | 9/2003 | Nishimura | ............ | 323/313 |
| 7,026,863 B2 * | 4/2006 | Aota | ............ | 327/539 |
| 2004/0207380 A1 * | 10/2004 | Takuya | ............ | 323/313 |

FOREIGN PATENT DOCUMENTS

| JP | 54-132753 | 10/1979 |
|---|---|---|
| JP | 4-65546 | 10/1992 |
| JP | 2001-284464 | 10/2001 |

* cited by examiner

*Primary Examiner*—Anh Phung
(74) *Attorney, Agent, or Firm*—Cooper & Dunham LLP

(57) ABSTRACT

A reference voltage generating circuit for producing a predetermined reference voltage at an output node includes a depletion-type n-channel field-effect transistor serving as a first field-effect transistor having one node thereof coupled to a power supply voltage, a second field-effect transistor having one node thereof coupled to another node of the first field-effect transistor and having a highly-doped n-type gate, and a third field-effect transistor having one node thereof coupled to another node of the second field-effect transistor, another node thereof coupled to a ground voltage, and a highly-doped p-type gate.

8 Claims, 18 Drawing Sheets

REFERENCE VOLTAGE GENERATING CIRCUIT AND CONSTANT VOLTAGE CIRCUIT

BACKGROUND OF THE INVENTION

1. Field of the Invention

The present invention generally relates to a reference voltage generating circuit and a constant voltage circuit using the reference voltage generating circuit, and particularly relates to a reference voltage generating circuit utilizing a difference in the work functions of gate electrodes between two field-effect transistors and to a constant voltage circuit using such reference voltage generating circuit.

2. Description of the Related Art

As shown in FIG. 19, a reference voltage generating circuit is conventionally known (see Patent Document 1) in which a depletion-type field-effect transistor and an enhancement-type field-effect transistor are connected in series, with a difference in the threshold voltages Vth of these field-effect transistors being extracted as a reference voltage Vref.

In FIG. 19, a transistor 105 is a depletion-type n-channel field-effect transistor, and a transistor 107 is an enhancement-type n-channel field-effect transistor. The drain current id of a field-effect transistor in the saturated state is represented as follows.

$$id = (K)(Vgs - Vth)^2 \quad (a)$$

In the equation (a), K represents a conductivity coefficient, and Vgs represents a voltage between the gate and the source.

Since the same current runs through the transistors 105 and 107, a voltage Vgs7 at a node 108 is represented as follows.

$$Vgs7 = Vth7 - (K5/K7)^{1/2}(Vth5) \quad (b)$$

In the equation (b), K5 represents the conductivity coefficient of the transistor 105, K7 the conductivity coefficient of the transistor 107, Vth5 the threshold voltage of the transistor 105, and Vth7 the threshold voltage of the transistor 107.

When the conductivity coefficient K5 is set equal to K7, the equation (b) is expressed as follows.

$$Vgs7 = Vth7 - Vth5 \quad (c)$$

In this manner, the voltage Vgs7 of the node 108 is set to a difference in the threshold voltages between the transistor 105 and the transistor 107. This voltage is denoted as a reference voltage Vref in FIG. 20.

As shown in FIG. 21, a reference voltage generating circuit is known (see Patent Document 2) in which a constant current is made to run through a transistor having an n-type gate and a transistor having a p-type gate, with a difference in the threshold voltages of these transistors being extracted as a reference voltage Vref.

In FIG. 21, a constant current Io is made to run through a transistor T1 having an n-type gate and a transistor T2 having a p-type gate that have almost identical conductivity coefficients K, so that the constant current Io is represented as follows.

$$Io = (K)(V1 - Vth1)^2 = (K)(V2 - Vth2)^2 \quad (d)$$

In the equation (d), V1 represents the voltage between the drain and source of the transistor T1, Vth1 the threshold voltage of the transistor T1, V2 the voltage between the drain and source of the transistor T2, and Vth2 the threshold voltage of the transistor T2.

From the equation (d), the following equation is derived.

$$V2 - V1 = Vth2 - Vth1$$

In this manner, a difference in the drain voltages between the transistor T1 and the transistor T2 is extracted so as to extract a difference in the threshold voltages between the transistor T1 and the transistor T2.

FIG. 22 is a drawing showing a circuit diagram for extracting a difference in drain voltages (see Patent Document 2, for example). In the circuit shown in FIG. 22, the compositions of the gate electrodes of transistors are changed to provide different threshold voltages for the transistors T1 and T2, rather than using two types of transistors, i.e., a depletion-type transistor and an enhancement-type transistor.

[Patent Document 1] Japanese Patent Publication No. 4-65546

[Patent Document 2] Japanese Patent Application Publication No. 54-132753

The circuit of FIG. 21 has at least three problems as follows.

First, since two types of transistors, i.e., a depletion-type transistor and an enhancement-type transistor, are used, the threshold voltages Vth of the transistors vary independently of each other due to process variation, resulting in the initial precision of the reference voltage Vref being poor. With the variations of the threshold voltages Vth of the transistors being denoted as $\Delta Vth5$ and $\Delta Vth7$ as shown in FIG. 23, a variation in the reference voltage Vref ranges from $-(\Delta Vth5 + \Delta Vth7)$ to $(\Delta Vth5 + \Delta Vth7)$. If Vth5=−0.5 V, Vth7=0.5 V, and $\Delta Vth5 = \Delta Vth7 = 0.15$ V, for example, the reference voltage Vref may vary from 0.7 V to 1.3 V (±30%). There is thus a problem in that the reference voltage Vref suffers large variation.

Second, since two types of transistors, i.e., a depletion-type transistor and an enhancement-type transistor, are used, the temperature characteristics of the potential difference of the transistor channel regions are not identical, resulting in the temperature characteristics being poor. In order to improve the temperature characteristics, a ratio S5 (=W/L) of a channel width W to a channel length L of the transistor 105 and a ratio S7 (=W/L) of a channel width W to a channel length L of the transistor 107 may be adjusted to change the ratio S5/S7. However, this can only achieve approximately 300 ppm/° C. in the best case. In this manner, there is a problem in that the temperature characteristics of the reference voltage Vref are large.

Third, the source-drain voltages Vds5 and Vds7 of the transistors 105 and 107 are represented as follows.

$$Vds5 = VCC - Vg7$$

$$Vds7 = Vg7$$

When the power supply voltage VCC fluctuates, thus, the source-drain voltage Vds5 of the transistor 105 ends up fluctuating also, resulting in the reference voltage Vref fluctuating in response to the fluctuation of the power supply voltage VCC. As shown in FIG. 24, the curve representing the relationship between the gate-source voltage Vgs of the transistor 105 and the drain current id is displaced as the power supply voltage VCC increases, thereby giving rise to a problem in that the reference voltage Vref increases by $\Delta Vref$.

The circuit shown in FIG. 22 overcomes the first and second problems described above, but cannot obviate the third problem since a resistor is used as a constant current source.

Accordingly, there is a need for a reference voltage generating circuit and a constant voltage circuit using the reference voltage generating circuit in which variation in the reference voltage due to process variation, temperature variation, and power supply voltage variation is reduced.

SUMMARY OF THE INVENTION

It is a general object of the present invention to provide a reference voltage generating circuit and constant voltage circuit that substantially obviate one or more problems caused by the limitations and disadvantages of the related art.

Features and advantages of the present invention will be presented in the description which follows, and in part will become apparent from the description and the accompanying drawings, or may be learned by practice of the invention according to the teachings provided in the description. Objects as well as other features and advantages of the present invention will be realized and attained by a reference voltage generating circuit and constant voltage circuit particularly pointed out in the specification in such full, clear, concise, and exact terms as to enable a person having ordinary skill in the art to practice the invention.

To achieve these and other advantages in accordance with the purpose of the invention, the invention provides a reference voltage generating circuit for producing a predetermined reference voltage at an output node, which includes a depletion-type n-channel field-effect transistor serving as a first field-effect transistor having one node thereof coupled to a power supply voltage, a second field-effect transistor having one node thereof coupled to another node of the first field-effect transistor and having a highly-doped n-type gate, and a third field-effect transistor having one node thereof coupled to another node of the second field-effect transistor, another node thereof coupled to a ground voltage, and a highly-doped p-type gate, wherein a gate of the first field-effect transistor is coupled to a joint point between the first field-effect transistor and the second field-effect transistor, substrate gates of the first and third field-effect transistors coupled to the ground voltage, and the gate and substrate gate of the second field-effect transistor and the gate of the third field-effect transistor coupled to a joint point serving as the output node between the second field-effect transistor and the third field-effect transistor, and wherein each of the second and third field-effect transistors is configured to have such a ratio of a channel width to a channel length that a characteristic indicating a relationship between a gate-source voltage and a drain current exhibit a positive temperature dependency for both of the second and third field-effect transistors or a negative temperature dependency for both of the second and third field-effect transistors.

According to another aspect of the present invention, a reference voltage generating circuit for producing a predetermined reference voltage at an output node includes a depletion-type n-channel field-effect transistor serving as a first field-effect transistor having one node thereof coupled to a power supply voltage, a second field-effect transistor having one node thereof coupled to another node of the first field-effect transistor and having a highly-doped n-type gate, and a third field-effect transistor having one node thereof coupled to another node of the second field-effect transistor, another node thereof coupled to a ground voltage, and a highly-doped p-type gate, wherein a gate of the first field-effect transistor is coupled to a joint point between the first field-effect transistor and the second field-effect transistor, substrate gates of the first through third field-effect transistors coupled to the ground voltage, and the gate of each of the second and third field-effect transistors coupled to a joint point serving as the output node between the second field-effect transistor and the third field-effect transistor, and wherein each of the second and third field-effect transistors is configured to have such a ratio of a channel width to a channel length that a characteristic indicating a relationship between a gate-source voltage and a drain current exhibit a positive temperature dependency for both of the second and third field-effect transistors or a negative temperature dependency for both of the second and third field-effect transistors.

According to another aspect of the present invention, a constant voltage circuit for generating a predetermined constant voltage from an input voltage by using a predetermined reference voltage generated by a reference voltage generating circuit as a reference, wherein the reference voltage generating circuit includes a depletion-type n-channel field-effect transistor serving as a first field-effect transistor having one node thereof coupled to a power supply voltage, a second field-effect transistor having one node thereof coupled to another node of the first field-effect transistor and having a highly-doped n-type gate, and a third field-effect transistor having one node thereof coupled to another node of the second field-effect transistor, another node thereof coupled to a ground voltage, and a highly-doped p-type gate, wherein a gate of the first field-effect transistor is coupled to a joint point between the first field-effect transistor and the second field-effect transistor, substrate gates of the first and third field-effect transistors coupled to the ground voltage, and the gate and substrate gate of the second field-effect transistor and the gate of the third field-effect transistor coupled to a joint point serving to provide the reference voltage between the second field-effect transistor and the third field-effect transistor, and wherein each of the second and third field-effect transistors is configured to have such a ratio of a channel width to a channel length that a characteristic indicating a relationship between a gate-source voltage and a drain current exhibit a positive temperature dependency for both of the second and third field-effect transistors or a negative temperature dependency for both of the second and third field-effect transistors.

According to another aspect of the present invention, a constant voltage circuit for generating a predetermined constant voltage from an input voltage by using a predetermined reference voltage generated by a reference voltage generating circuit as a reference, wherein the reference voltage generating circuit includes a depletion-type n-channel field-effect transistor serving as a first field-effect transistor having one node thereof coupled to a power supply voltage, a second field-effect transistor having one node thereof coupled to another node of the first field-effect transistor and having a highly-doped n-type gate, and a third field-effect transistor having one node thereof coupled to another node of the second field-effect transistor, another node thereof coupled to a ground voltage, and a highly-doped p-type gate, wherein a gate of the first field-effect transistor is coupled to a joint point between the first field-effect transistor and the second field-effect transistor, substrate gates of the first through third field-effect transistors coupled to the ground voltage, and the gate of each of the second and third field-effect transistors coupled to a joint point serving to provide the reference voltage between the second field-effect transistor and the third field-effect transistor, and wherein each of the second and third field-effect transistors is configured to have such a ratio of a channel width to a channel length that a characteristic indicating a relationship between a gate-source voltage and a drain current exhibit a positive temperature dependency for both of the second and third field-effect transistors or a negative temperature dependency for both of the second and third field-effect transistors.

According to at least one embodiment of the present invention, the reference voltage generated by the reference voltage generating circuit has an initial precision that is improved to ±6% from ±30% of the related-art configuration, and has a temperature characteristic that is improved to 40 ppm/° C. from 300 ppm/° C. of the related-art configuration. Further, the fluctuation of the reference voltage responding to power-supply-voltage fluctuation is reduced to less than 1/10 of that of the related-art configuration. In this manner, variation in the reference voltage due to process variation, temperature variation, and power-supply-voltage variation is reduced. With respect to the constant voltage circuit, also, variation in the output voltage is reduced.

BRIEF DESCRIPTION OF THE DRAWINGS

Other objects and further features of the present invention will be apparent from the following detailed description when read in conjunction with the accompanying drawings, in which.

DESCRIPTION OF THE PREFERRED EMBODIMENTS

In the following, embodiments of the present invention will be described with reference to the accompanying drawings.

First Embodiment

Figure 1:
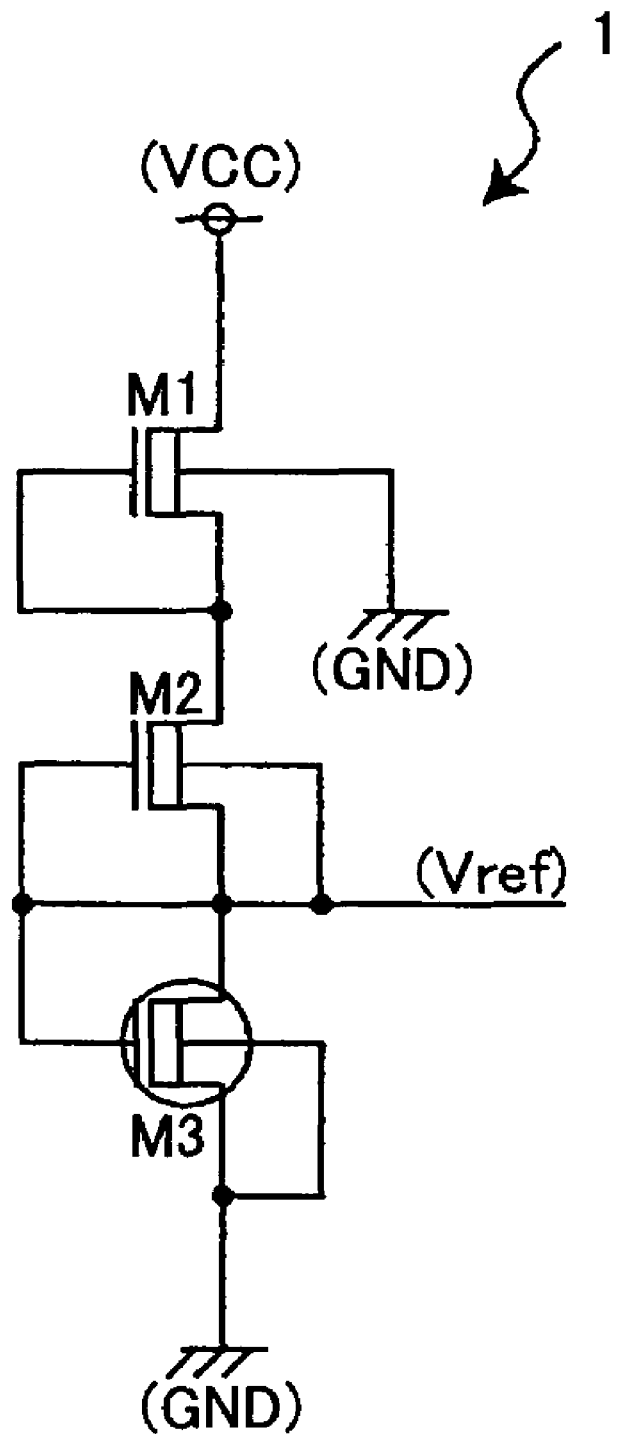
FIG. 1 is a drawing showing an example of a reference voltage generating circuit according to a first embodiment of the present invention.

FIG. 1 is a drawing showing an example of a reference voltage generating circuit according to a first embodiment of the present invention.

A reference voltage generating circuit 1 shown in FIG. 1 includes n-channel-type field-effect transistors M1 through M3, which are connected in series between a power supply voltage VCC and a ground voltage GND. The field-effect transistor M1 corresponds to a first field-effect transistor, the field-effect transistor M2 to a second field-effect transistor, and the field-effect transistor M3 to a third field-effect transistor.

The field-effect transistor M1 is a depletion-type transistor which is formed in a P well disposed in an n-type substrate, and has the gate and source thereof connected together, with the substrate gate being coupled to the ground voltage GND. The field-effect transistors M2 and M3 have the impurity concentrations thereof being identical to each other in the substrate and channel doped regions, and are formed in a P well disposed in the n-type substrate. The field-effect transistor M2 has a highly doped n-type gate, and the field-effect transistor M3 has a highly doped p-type gate. A joint point between the field-effect transistors M2 and M3 is connected to the gates of the field-effect transistors M2 and M3 and also connected to the substrate gate of the field-effect transistor M2. This joint point serves as an output node for outputting a reference voltage Vref, and the field-effect transistor M2 serves as a constant current source. The substrate gate of the field-effect transistor M3 is coupled to the ground voltage.

In this configuration, the reference voltage Vref is represented as follows.

$$Vref = VthM3 - (KM2/KM3)^{1/2}(VthM2) \qquad (1)$$

In the equation (1), KM2 represents the conductivity coefficient of the field-effect transistor M2, KM3 the conductivity coefficient of the field-effect transistor M3, VthM2 the threshold voltage of the field-effect transistor M2, and VthM3 the threshold voltage of the field-effect transistor M3.

When the conductivity coefficients of the field-effect transistors M2 and M3 are set equal to each other, the equation (1) is expressed as follows.

$$Vref = VthM3 - VthM2 \quad (2)$$

As is shown in the equation (2), the reference voltage Vref is a difference in the threshold voltages between the field-effect transistors M2 and M3.

Figure 2:
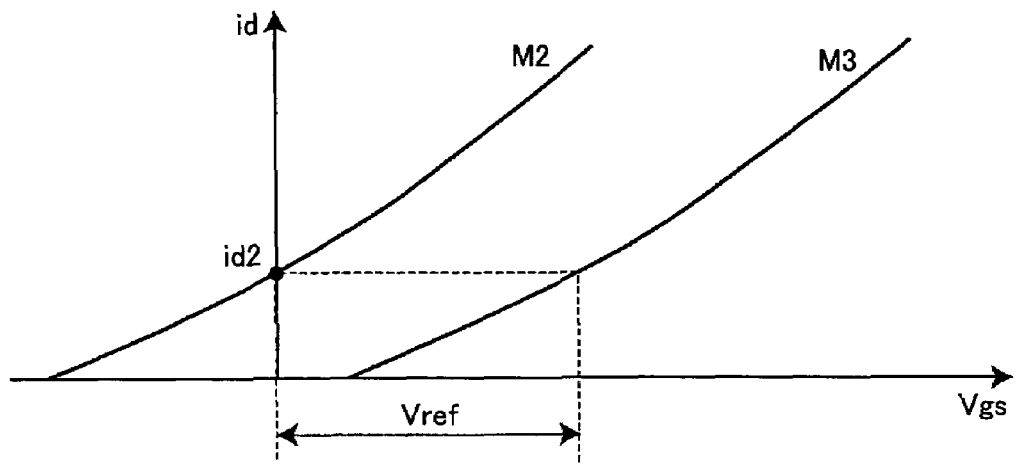
FIG. 2 is a drawing showing an example of the Vgs-id characteristics of field-effect transistors M2 and M3 shown in FIG. 1.

FIG. 2 is a drawing showing Vgs-id characteristics of the field-effect transistors M2 and M3 which demonstrate the relationships between the gate-source voltage Vgs and the drain current id.

In FIG. 2, a drain current id2 flows through the field-effect transistor M2 since its source and gate are connected to each other. Since the field-effect transistor M3 is connected in series to the field-effect transistor M2, the field-effect transistor M3 has the same current id2 running there through. A voltage difference between the gate-source voltage Vgs of the field-effect transistor M2 and the gate-source voltage Vgs of the field-effect transistor M3 appears as the reference voltage Vref.

Figure 3:
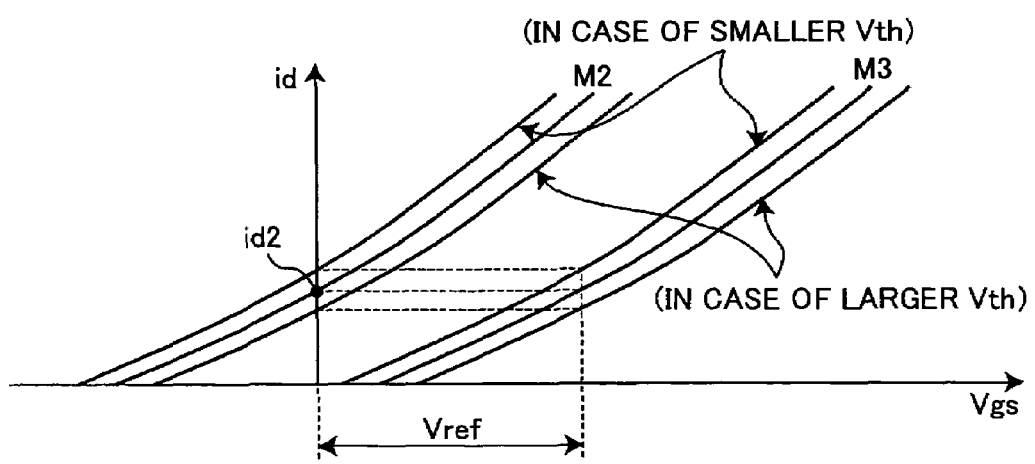
FIG. 3 is a drawing showing variation in the Vgs-id characteristics of the field-effect transistors M2 and M3 due to process variation.

Even if impurity concentrations in the substrate and channel doped regions vary due to process variation, these impurity concentrations vary in the same manner between the field-effect transistor M2 and the field-effect transistor M3. As shown in FIG. 3, the Vgs-id characteristics of the field-effect transistors M2 and M3 exhibit a shift to the right or to the left while maintaining the mutual relationship shown in FIG. 2, so that the absolute value of the reference voltage Vref experiences almost no change. A stable reference voltage Vref can thus be generated. Experiments demonstrated that the variation in the reference voltage Vref fell within about ±1% range, indicating the effect of reducing the variation of the reference voltage Vref.

Figure 19:
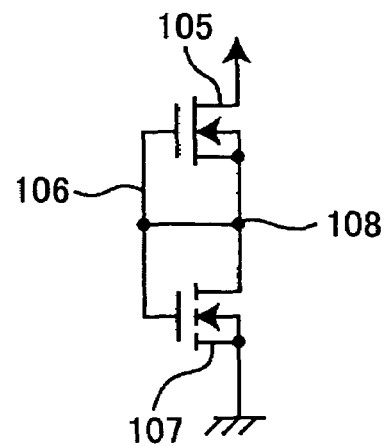
FIG. 19 is a drawing showing an example of a related-art reference voltage generating circuit.
Figure 20:
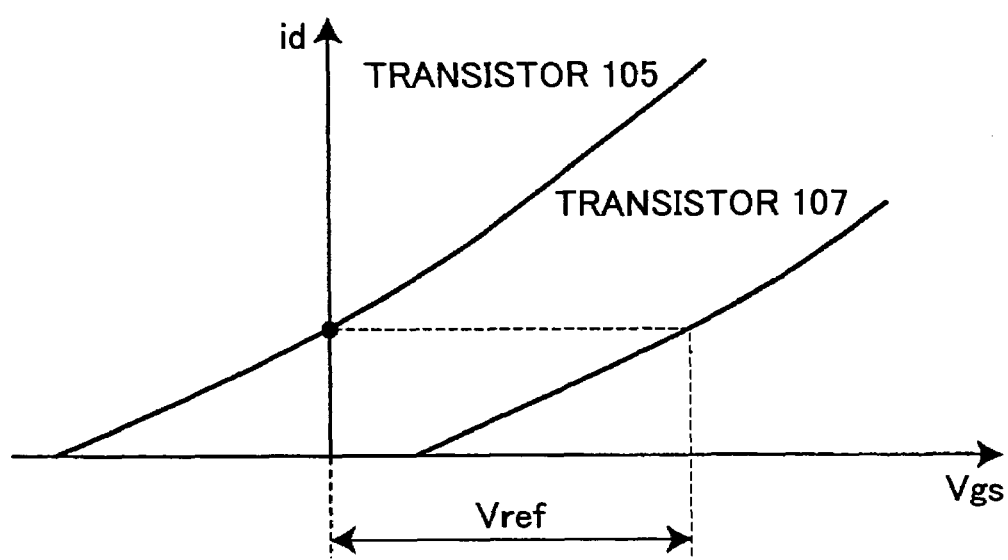
FIG. 20 is a drawing showing an example of the Vgs-id characteristics of field-effect transistors shown in FIG. 19.
Figure 21:
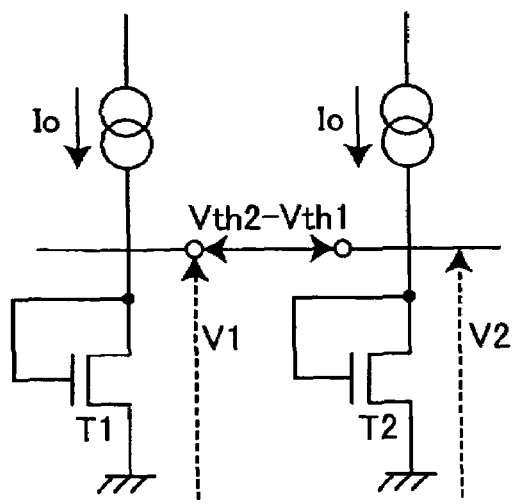
FIG. 21 is a drawing showing another example of a related-art reference voltage generating circuit.
Figure 22:
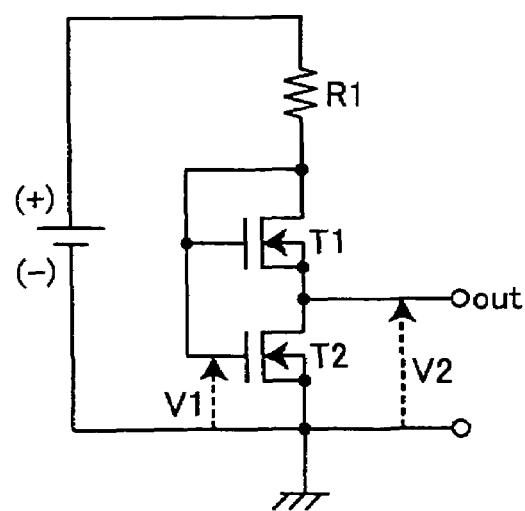
FIG. 22 is a drawing showing another example of a related-art reference voltage generating circuit.
Figure 23:
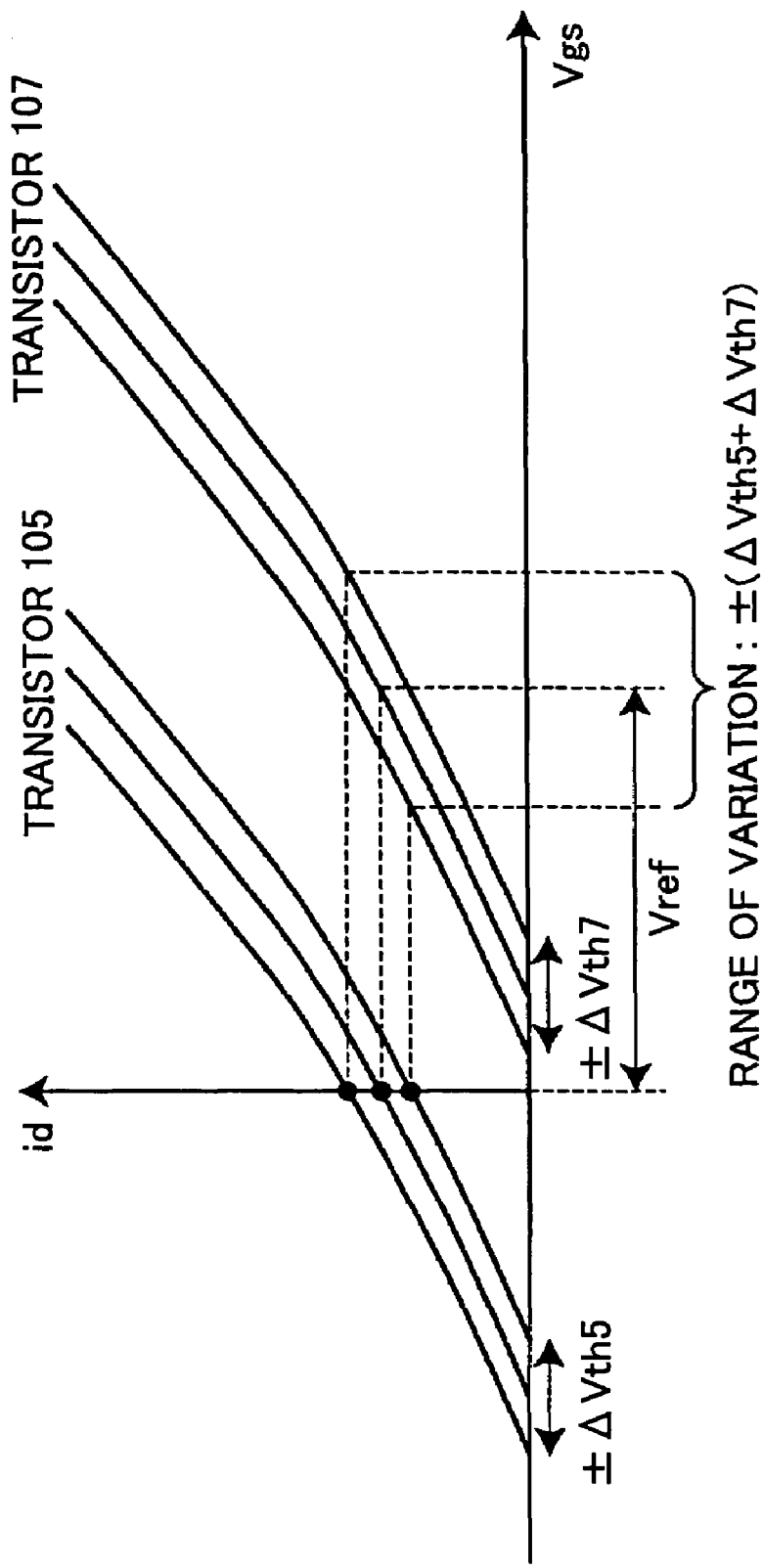
FIG. 23 is a drawing showing variation in the Vgs-id characteristics of the field-effect transistors shown in FIG. 19 as caused by process variation.
Figure 24:
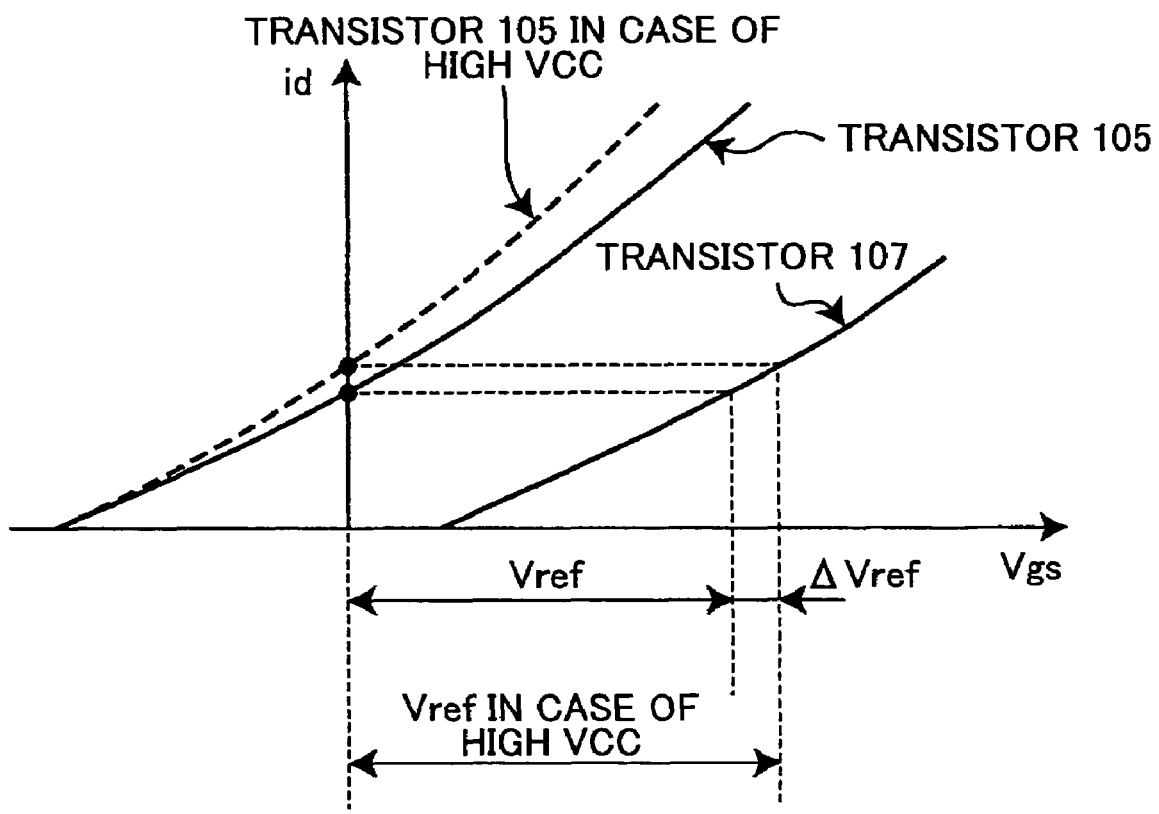
FIG. 24 is a drawing showing variation in the Vgs-id characteristics of a field-effect transistor shown in FIG. 19 as caused by power-supply-voltage variation.

The field-effect transistors M2 and M3 are depletion-type transistors having the impurity concentrations thereof identical to each other in the substrate and channel doped regions. The field-effect transistor M2 has a highly doped n-type gate, and the field-effect transistor M3 has a highly doped p-type gate. Even when the temperature characteristics of the potential difference of the channel regions in the field-effect transistors M2 and M3 are set equal, i.e., even when the conductivity coefficients are set equal to each other in the above equation (1), the resulting reference voltage Vref ends up having a temperature characteristic of approximately −500 ppm/° C. due to the temperature characteristics of the difference in the gate work functions. Such temperature characteristic is smaller than that of the related-art configuration shown in FIG. 19, in which two types of transistors, i.e., a depletion-type transistor and an enhancement-type transistor, are used, and the temperature characteristics of the potential difference of the channel regions in the field-effect transistors are not identical despite the fact that there is no temperature characteristics caused by a difference in the gate work functions.

In consideration of this, a ratio S2 (=W2/L2) of a channel width W2 to a channel length L2 of the field-effect transistor M2 and a ratio S3 (=W3/L3) of a channel width W3 to a channel length L3 of the field-effect transistor M3 may be adjusted to further improve the temperature characteristics of the reference voltage Vref.

Figure 4:
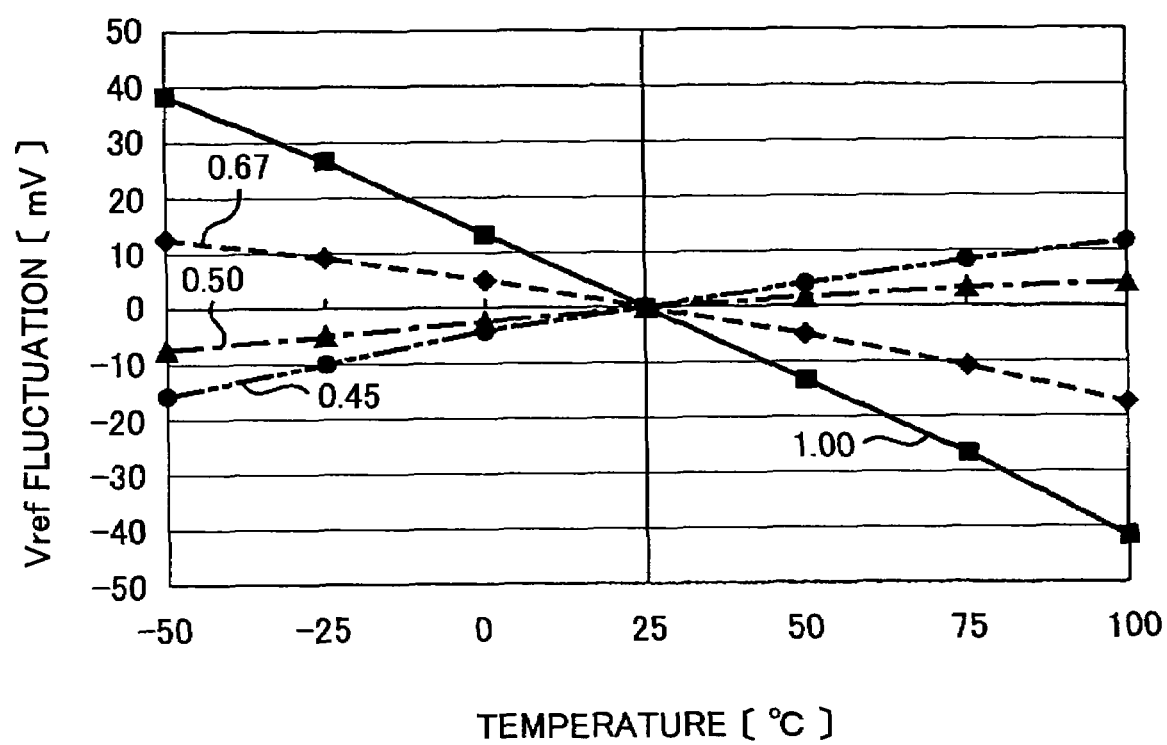
FIG. 4 is a drawing showing experimental data of the temperature characteristic of a reference voltage Vref with respect to various S3/S2 ratios in the reference voltage generating circuit of FIG. 1.

FIG. 4 is a drawing showing the experimental data of temperature characteristics of the reference voltage Vref when the ratio S3/S2 is changed. In FIG. 4, the experimental data is shown with 25° C. being placed at the center.

In FIG. 4, the solid line illustrates data obtained when S3/S2=1.00. In this state, the temperature characteristics of the reference voltage Vref showed a negative value of −545 ppm/° C. In FIG. 4, the dashed line illustrates data obtained when S3/S2=0.67. In this state, the temperature characteristics of the reference voltage Vref showed a negative value of −191 ppm/° C.

In FIG. 4, the chain line illustrates data obtained when S3/S2=0.50. In this state, the temperature characteristics of the reference voltage Vref showed a positive value of 60 ppm/° C. In FIG. 4, the two-dot chain line illustrates data obtained when S3/S2=0.45. In this state, the temperature characteristics of the reference voltage Vref showed a positive value of 154 ppm/° C. It is thus found that a minimum point of the temperature characteristics of the reference voltage Vref occurs when S3/S2 is between 0.5 and 0.67. The value S3/S2 that would achieve this minimum point was estimated to be 0.54 through 0.58, and the temperature characteristics of the reference voltage Vref in such a case would be approximately 40 ppm/° C.

Figure 5:
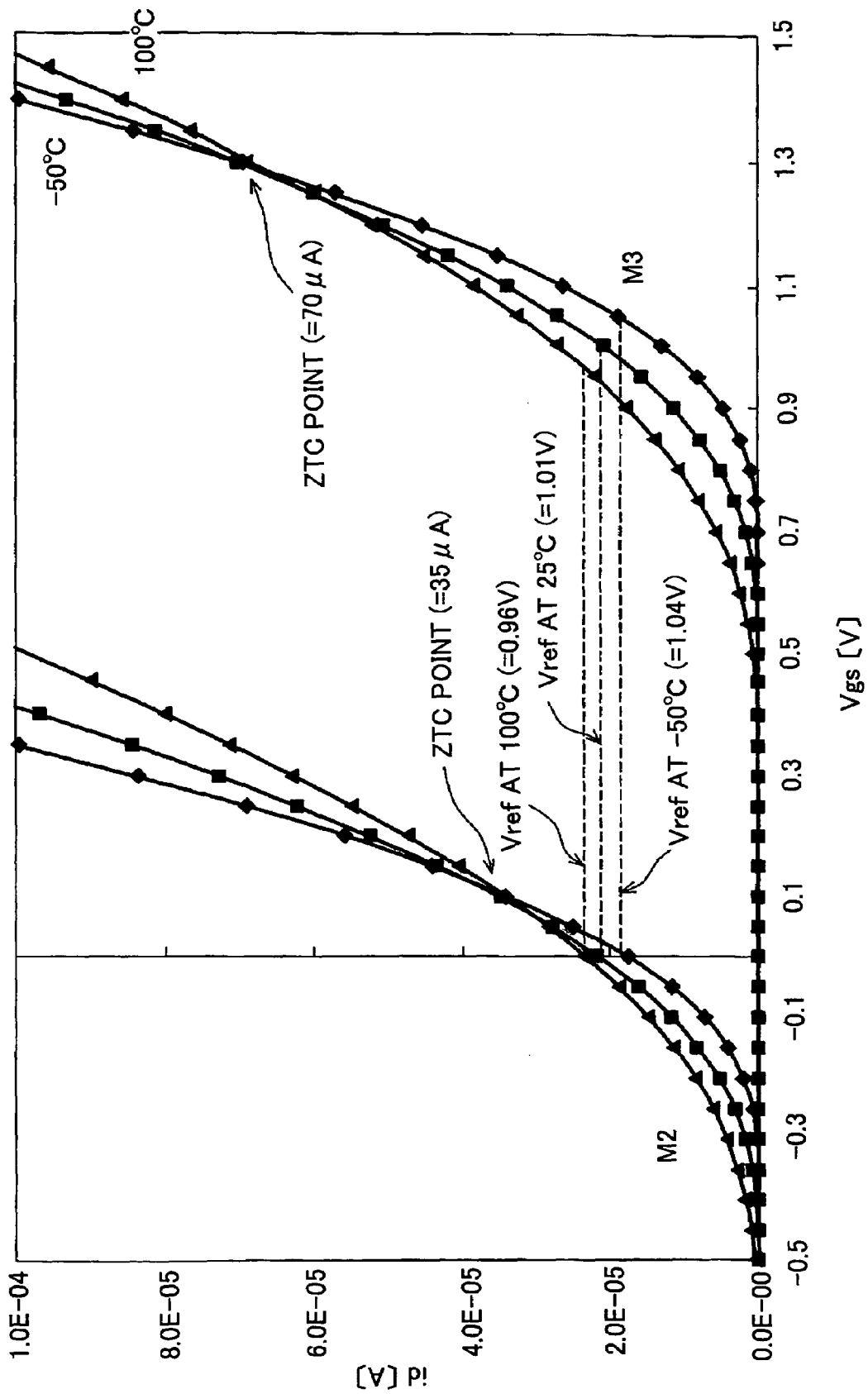
FIG. 5 is a drawing showing an example of the Vgs-id characteristics of the field-effect transistors M2 and M3 at each temperature.

FIG. 5 is a drawing showing an example of the Vgs-id characteristics of the field-effect transistors M2 and M3 obtained through experiments for various temperatures when a ratio W/L of the channel width W to the channel length L is set to 50/10 with respect to the field-effect transistors M2 and M3.

As can be seen from FIG. 5, the Vgs-id characteristics of the field-effect transistors M2 and M3 when the ratio W/L is set to 50/10 have a ZTC point (zero temperature coefficient point) at which almost identical drain currents flow regardless of temperature changes because the threshold voltage Vth and the temperature characteristics of mobility are canceled. The ZTC point of the field-effect transistor M2 occurs when the drain current is 35 microampere, and the ZTC point of the field-effect transistor M3 occurs when the drain current is 70 microampere.

The field-effect transistor M2 serves as a constant current source. In FIG. 1, thus, with the drain current being denoted as idM when the gate-source voltage Vgs of the field-effect transistor M2 is 0 V, this drain current idM flows through the field-effect transistor M3, which determines the reference voltage Vref at each temperature. The drain current when the gate-source voltage Vgs of the field-effect transistor M2 is 0 V is 18 microampere at −50° C., 21 microampere at 25° C., and 24 microampere at 100° C. The reference voltage Vref is 1.04 V at −50° C., 1.01 V at 25° C., and 0.96 V at 100° C. A temperature characteristic in this case is −517 ppm/° C.

Figure 6:
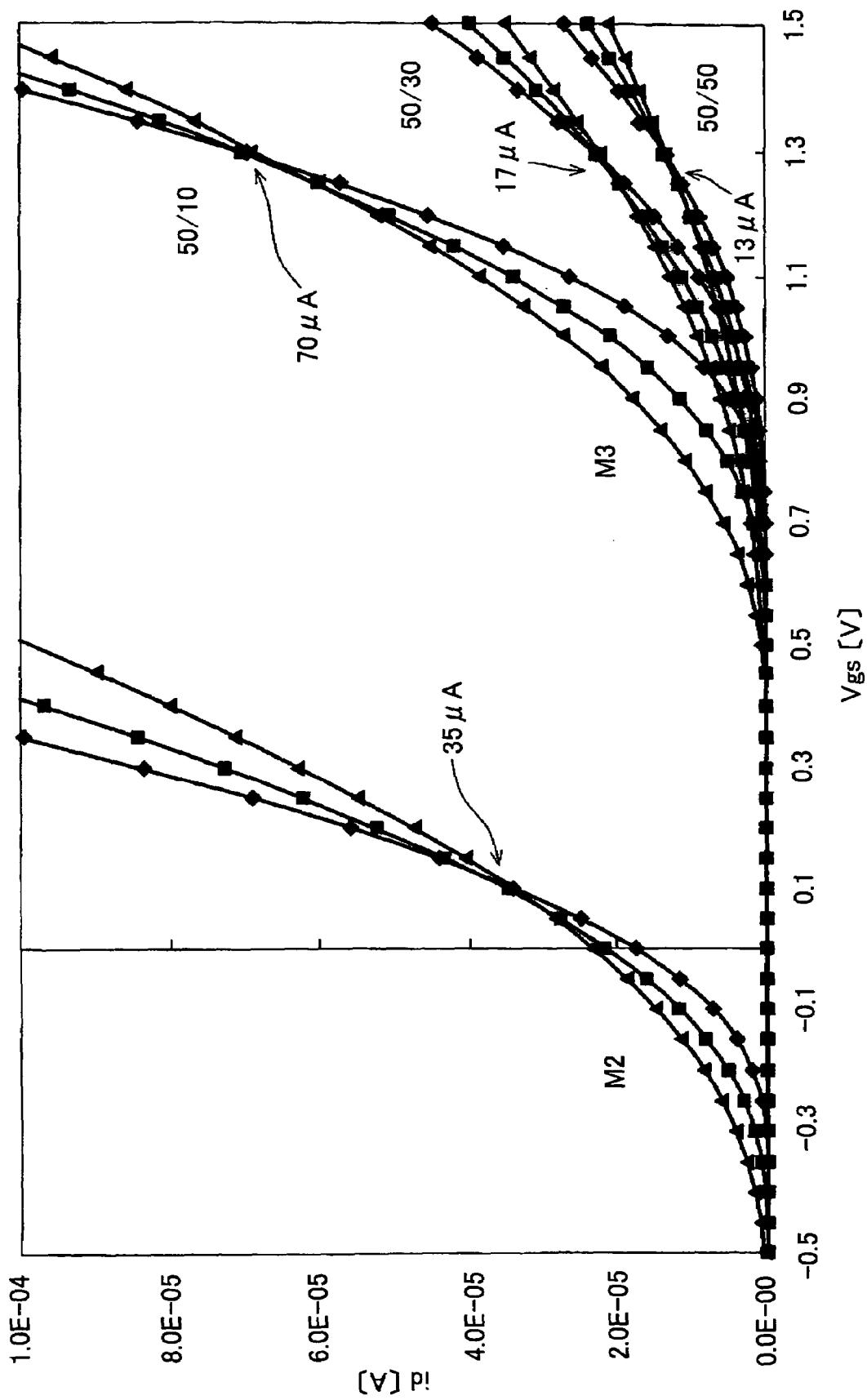
FIG. 6 is a drawing showing experimental data of Vgs-id characteristics when a W/L ratio is changed for the field-effect transistor M3.

FIG. 6 is a drawing showing the experimental data of Vgs-id characteristics and ZTC points when the W/L ratio is changed for the field-effect transistor M3. In FIG. 6, the ratio W/L of the field-effect transistor M2 is 50/10.

As shown in FIG. 6, when W/L of the field-effect transistor M3 is 50/10, the drain current of the field-effect transistor M3 at the ZTC point is 70 microampere. As the gate length L of the field-effect transistor M3 is increased, the drain current of the field-effect transistor M3 at the ZTC point decreases. When W/L of the field-effect transistor M3 is 50/30, the drain current of the field-effect transistor M3 at the ZTC point is 17 microampere. When W/L of the field-effect transistor M3 is 50/50, the drain current of the field-effect transistor M3 at the ZTC point is 13 microampere.

Figure 7:
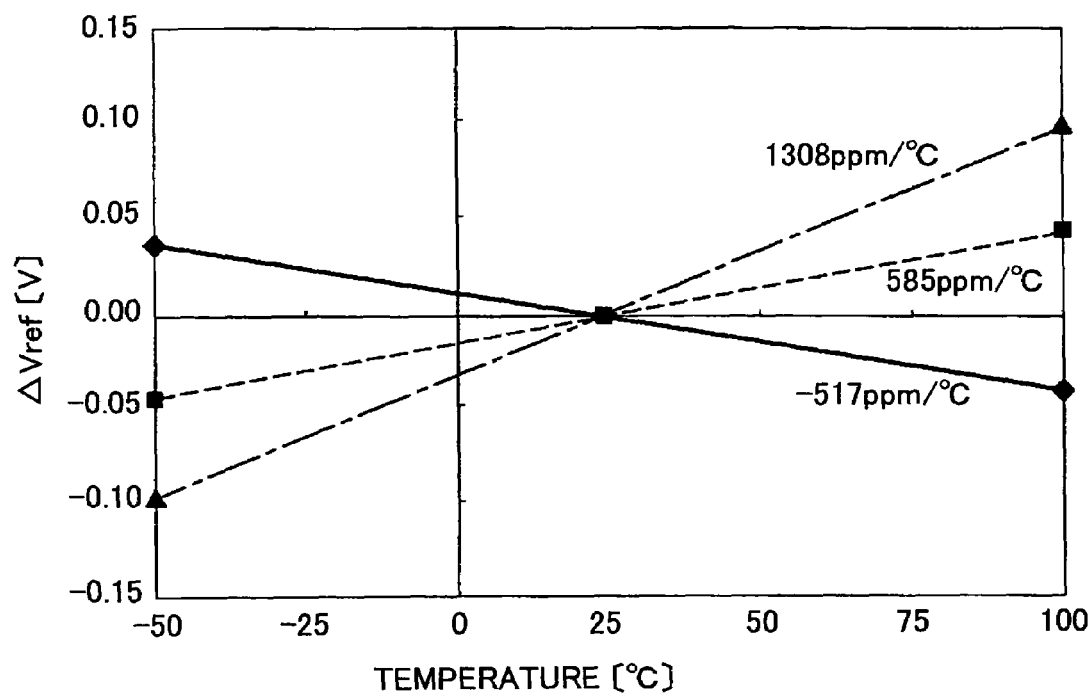
FIG. 7 is a drawing showing an example of the temperature characteristic of the reference voltage Vref when a W/L ratio is changed for a field-effect transistor M3 shown in FIG. 1.

FIG. 7 is a drawing showing the temperature characteristics of the reference voltage Vref when W/L of the field-effect transistor M3 is 50/10, 50/30, and 50/50. FIG. 7 shows an example in which the ratio W/L of the field-effect transistor M2 is 50/10.

In FIG. 7, the temperature characteristic of the reference voltage Vref is −517 ppm/° C. when W/L of the field-effect transistor M3 is 50/10 as shown by the solid line. The temperature characteristic of the reference voltage Vref is 585 ppm/° C. when W/L of the field-effect transistor M3 is 50/30 as shown by the dotted line. Further, the temperature characteristic of the reference voltage Vref is 1308 ppm/° C. when W/L of the field-effect transistor M3 is 50/50 as shown by the chain line.

When the reference voltage Vref has a negative temperature characteristic, the temperature characteristic of the gate-source voltage Vgs at the current idM is negative for both of the field-effect transistors M2 and M3. This is because the drain current is larger than the current idM at the ZTC point. However, the drain current at the ZTC point is larger for the field-effect transistor M3 than for the n-type field-effect transistor M2, so that the Vgs-id characteristics of the field-effect transistor M3 has a larger negative temperature characteristic. This overly cancels the temperature characteristic of the Vgs-id characteristics of the n-type transistor M2 having a negative temperature characteristic, resulting in the reference voltage Vref having a negative temperature characteristic.

When the reference voltage Vref has a positive temperature characteristic, the temperature characteristic of the gate-source voltage Vgs at the current idM is negative for the field-effect transistor M2. This is because the drain current is larger than the current idM at the ZTC point. In the case of the field-effect transistor M3, on the other hand, the drain current is smaller than the current idM at the ZTC point, so that the temperature characteristic of the gate-source voltage Vgs at the current idM is positive. Accordingly, the reference voltage Vref has a positive temperature characteristic. In order to minimize the temperature characteristic of the reference voltage Vref, thus, the field-effect transistor M3 needs to have a negative temperature characteristic approximately to the same degree as the field-effect transistor M2. Based on experiments, it was found that the minimum point of the temperature characteristic of the reference voltage Vref would occur when W/L of the field-effect transistor M3 was 50/18. The temperature characteristic was approximately 40 ppm/° C. in this case.

Figure 8:
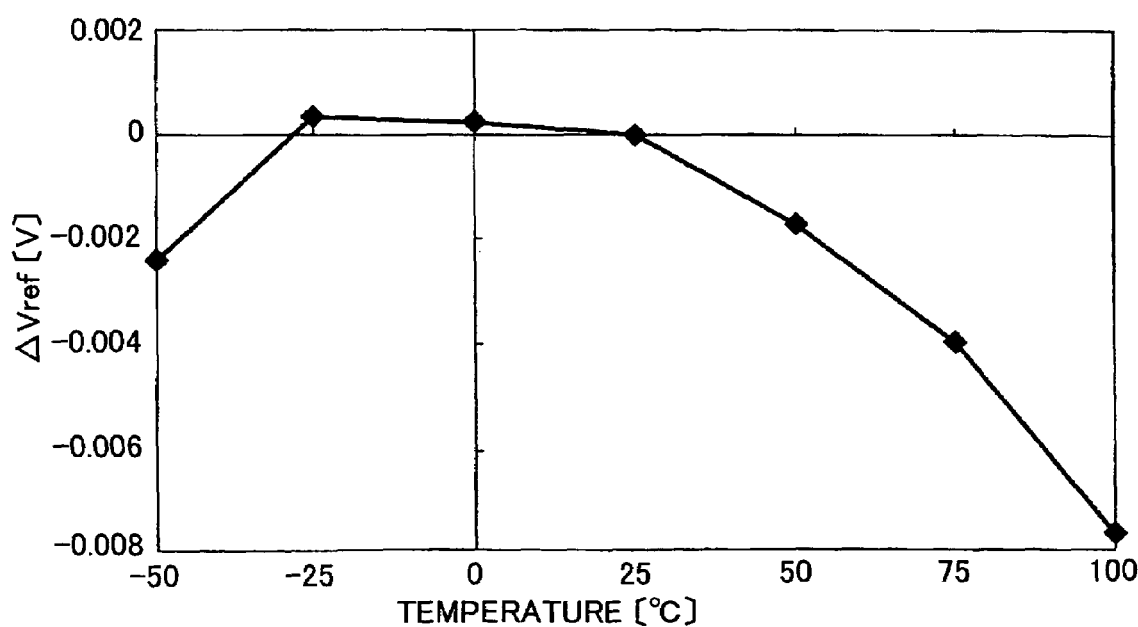
FIG. 8 is a drawing showing the temperature characteristics of the reference voltage Vref when W/L of the field-effect transistor M2 is 50/5, and W/L of the field-effect transistor M3 is 50/10.

When experiments were conducted to search for the minimum point of the temperature characteristic of the reference voltage Vref by changing the transistor size of the NMOS transistors M2 and M3, a phenomenon as shown in FIG. 8 was encountered.

FIG. 8 is a drawing showing the temperature characteristics of the reference voltage Vref when W/L of the field-effect transistor M2 is 50/5, and W/L of the field-effect transistor M3 is 50/10. In FIG. 8, the reference voltage Vref does not have a positive temperature characteristic all the time or a negative temperature characteristic all the time as shown in FIG. 7, but has a positive temperature characteristic on the lower temperature side and a negative temperature characteristic on the higher temperature side. The temperature characteristic is especially large when the temperature is high.

Figure 9:
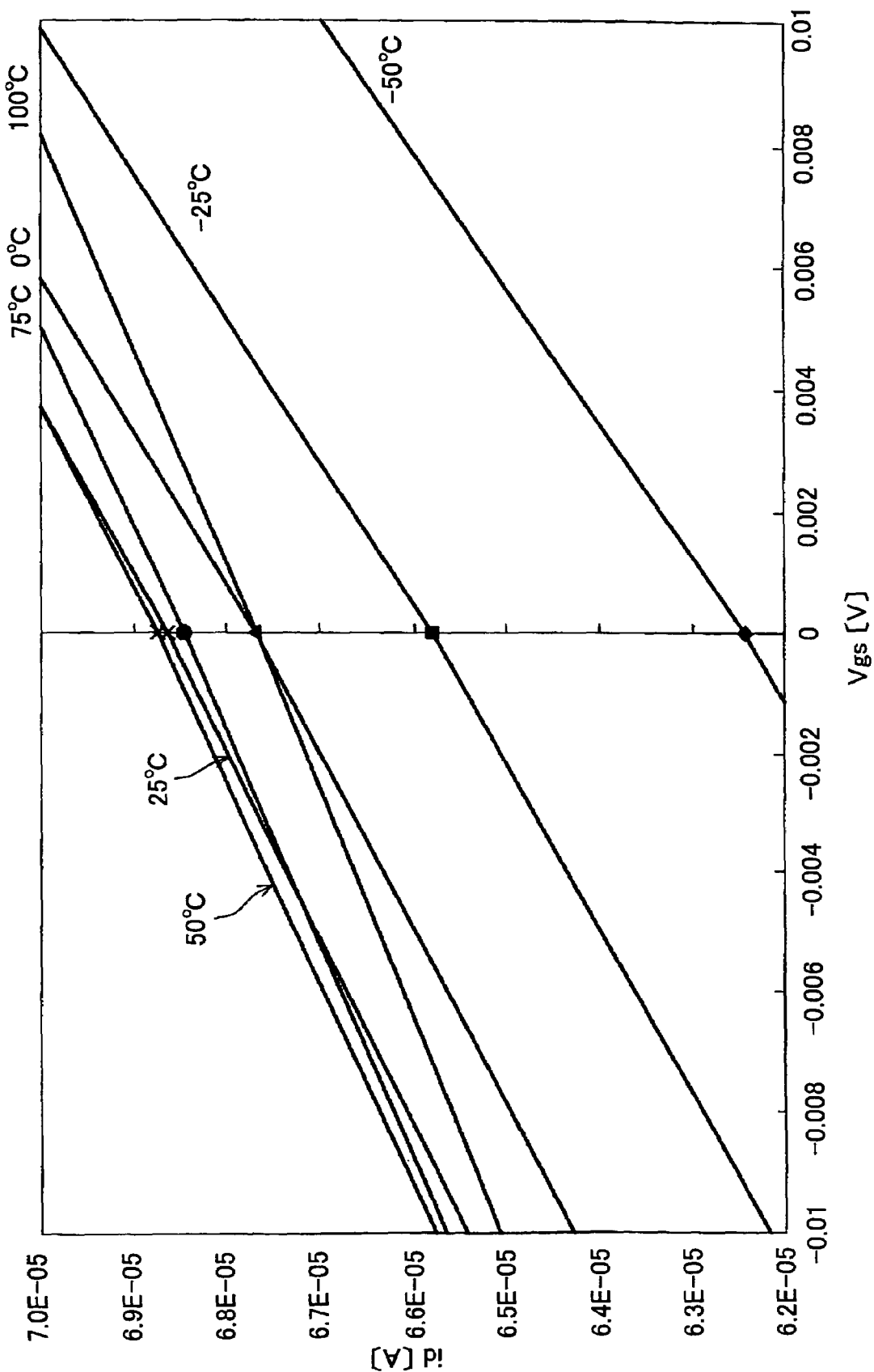
FIG. 9 is a drawing showing the Vgs-id characteristics of the field-effect transistor M2 when the gate-source voltage Vgs is around 0 V.

FIG. 9 is a drawing showing the Vgs-id characteristics of the field-effect transistor M2 when the gate-source voltage Vgs is around 0 V.

With a transistor about the size of the field-effect transistor M2, the drain current at the ZTC point is supposed to be larger than the current idM at the operating point. Because of this, the gate-source voltage Vgs is supposed to exhibit a negative temperature characteristic if the drain current id is constant. In other words, the drain current id is supposed to exhibit a positive temperature characteristic if the gate-source voltage Vgs is constant.

Figure 10:
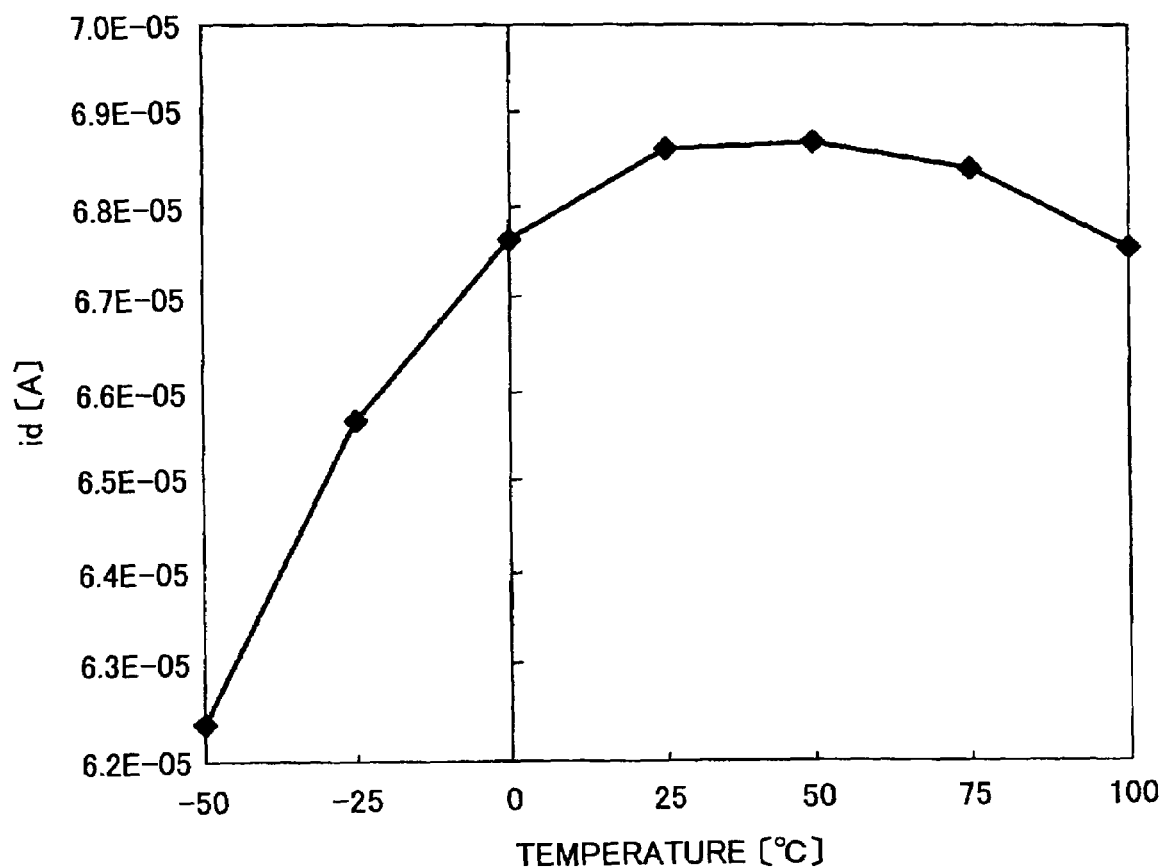
FIG. 10 is a drawing showing the temperature characteristic of a drain current of the field-effect transistor M2.
Figure 11:
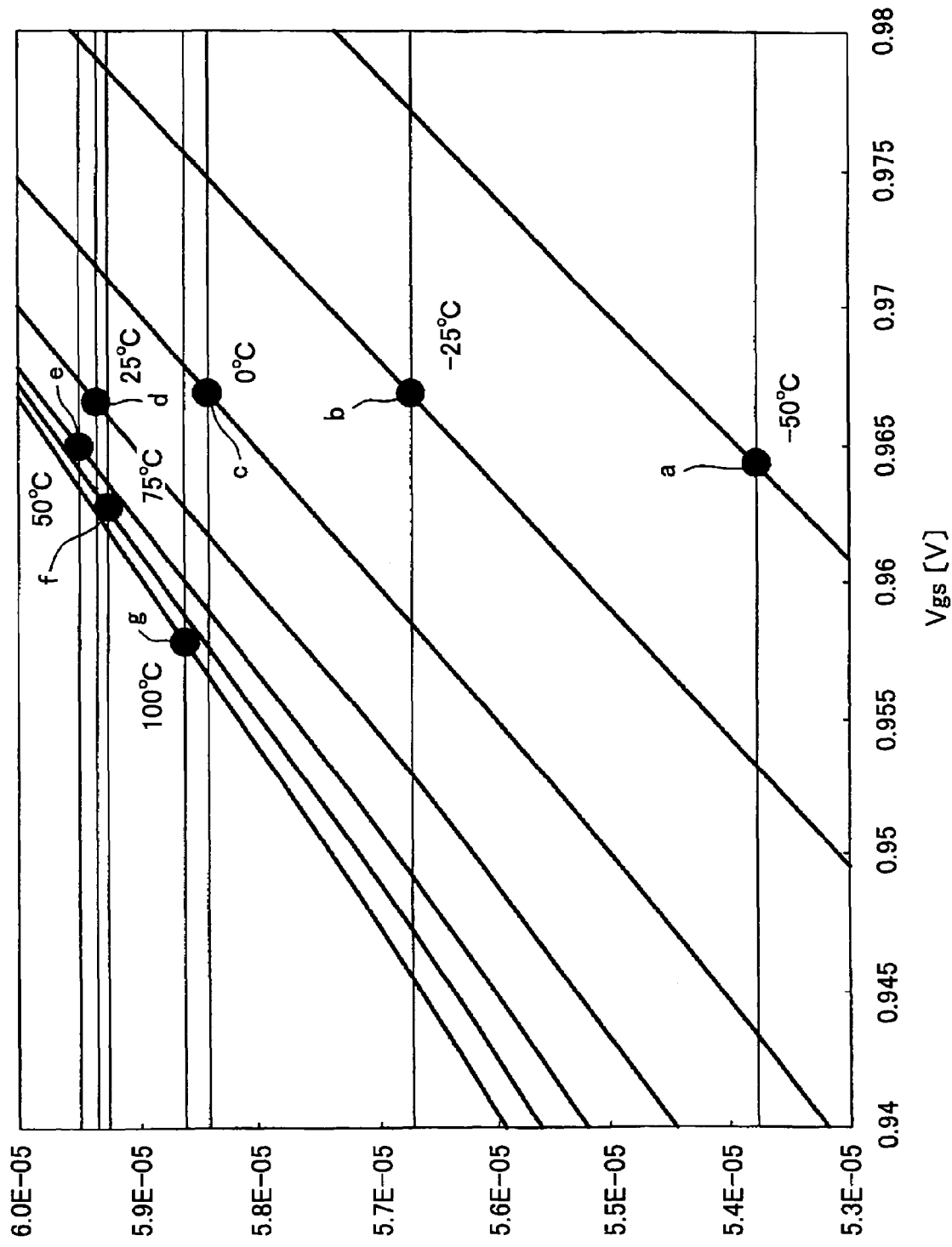
FIG. 11 is a drawing showing the operating points of the field-effect transistor M3 for various temperatures.

As shown in FIG. 10, however, the temperature characteristic of the drain current id of the field-effect transistor M2 when the gate-source voltage Vgs is 0 V has a dome shape, and is not an across-the-board positive temperature characteristic. Because of this, the operating point of the field-effect transistor M3 at each temperature is provided as shown by points "a" through "g" plotted in FIG. 11, so that the reference voltage Vref ends up having a temperature characteristic as shown in FIG. 8.

If there is a ZTC point at which all the characteristic curves intersect as shown in FIG. 5 or FIG. 6, an area in which the temperature characteristic of the gate-source voltage Vgs is negative and an area in which the temperature characteristic of the gate-source voltage Vgs is positive can be clearly separated. In reality, however, the curves do not intersect at a single point, so that there is an area in which a positive temperature characteristic of the gate-source voltage Vgs coexists with a negative temperature characteristic of the gate-source voltage Vgs. This area may be referred to as a ZTC area.

Figure 12:
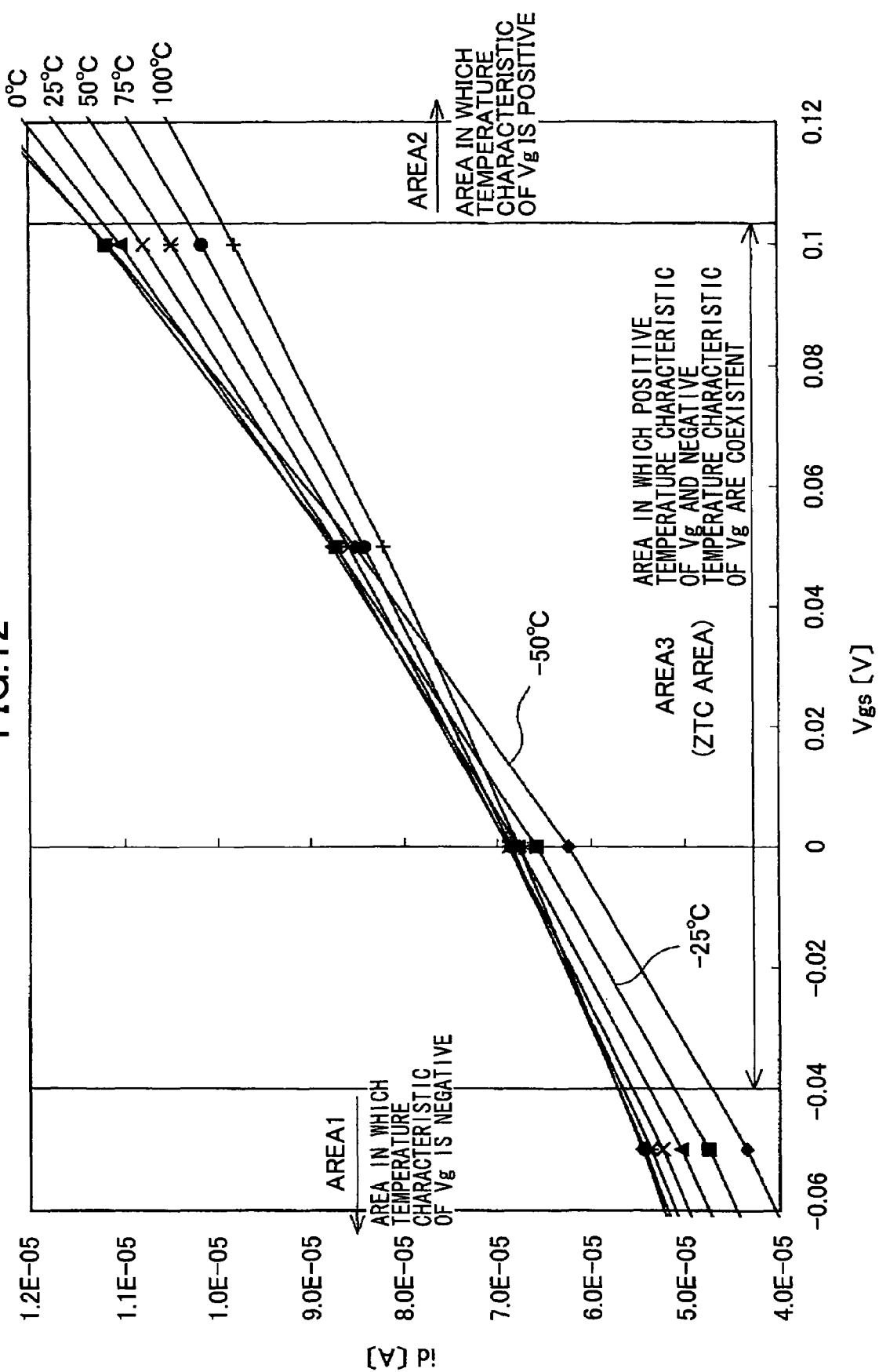
FIG. 12 is a drawing showing an enlarged view around the ZTC point of the field-effect transistor M2.

FIG. 12 is a drawing showing an enlarged view around the ZTC point of the field-effect transistor M2. As shown in FIG. 12, if a point at which the gate-source voltage Vgs is 0 V exists in the ZTC area (which is denoted as AREA3), the temperature characteristic of the drain current id exhibits a curve as shown in FIG. 10, so that the reference voltage Vref has a poor temperature characteristic on the higher-voltage side as shown in FIG. 8. In order to avoid such a situation, the operating point of the reference voltage generating circuit 1 of FIG. 1 needs to be situated in areas other than the ZTC area (AREA3).

As described above, the operating point of the circuit is set in areas other than the ZTC area (AREA3), and, then, the sizes of the field-effect transistors M2 and M3 are adjusted to set the temperature characteristic of the reference voltage Vref to an approximately 40 ppm/° C., thereby achieving a smaller temperature characteristic than in the related-art configuration. In this case, however, the conductivity coefficients of the equation (1) remain to exist, so that variation in the reference voltage Vref is increased to ±5 to 6%, which is still smaller than the variation of the reference voltage Vref in the related-art configuration.

Figure 13:
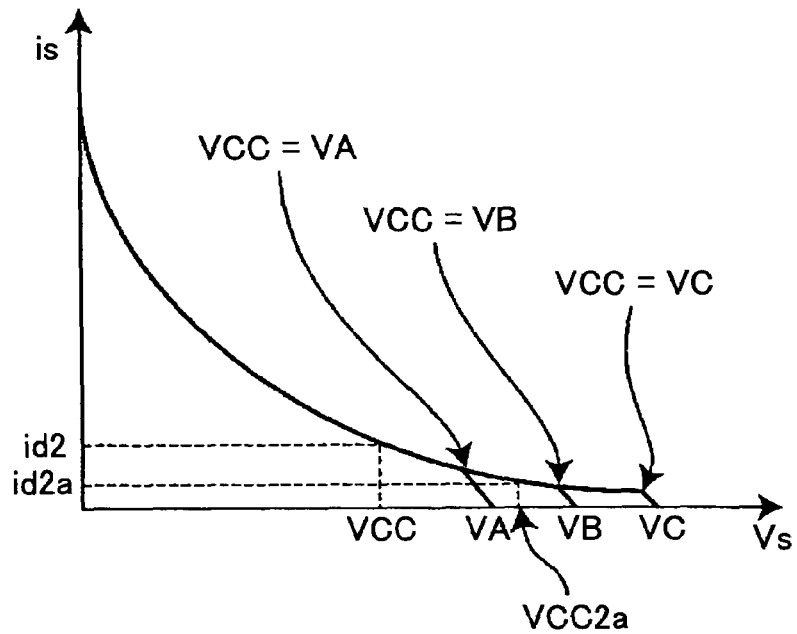
FIG. 13 is a drawing showing an example of the Vs-is characteristics of a field-effect transistor M1.

FIG. 13 is a drawing showing an example of the Vs-is characteristics of the field-effect transistor M1 which demonstrate the relationship between the source voltage Vs and the source current is.

In FIG. 13, the source current "is" is illustrated that is observed when the source voltage Vs is increased in the field-effect transistor M1 while the power supply voltage VCC is set to VA, VB and VC. When the power supply voltage VCC is VA, for example, the source current "is" rapidly drops as the source voltage Vs approaches VA. When Vs=VA, the source current "is" becomes zero. As shown in FIG. 2, the field-effect transistor M2 serving as a constant current source has the drain current id2 running there through, so that the field-effect transistor M1 situated on the common current path also has the same drain current id2 running there through.

Accordingly, the source voltage Vs of the field-effect transistor M1 is fixed to VCC2 regardless of the power supply voltage VCC. If id2 is too small, and becomes id2a, however, the source voltage Vs of the field-effect transistor M1 becomes VCC2a. When VCC=VB or VCC=VC, VCC2a<VB and VCC2a<VC, so that the source voltage Vs of the field-effect transistor M1 is fixed to VCC2a. When VCC=VA, however, VCC2a>VA, so that the source voltage Vs of the field-effect transistor M1 can only reach VA. Accordingly, the required current id2 or VCC2 needs to be set by taking into account the minimum operating voltage of the circuit. Such setting can easily be made by adjusting the gate width W or gate length L of the field-effect transistor M1.

Provision of the field-effect transistor M1 as described above achieves the source-drain voltages VdsM2 and VdsM3 of the field-effect transistors M2 and M3 as follows.

$$VdsM2 = VCC2 - Vref$$

$$VdsM3 = Vref$$

Accordingly, even when the power supply voltage VCC fluctuates, the source-drain voltages of the field-effect transistors M2 and M3 are not affected by such fluctuation, which ensures that the reference voltage Vref does not fluctuate.

Figure 14:
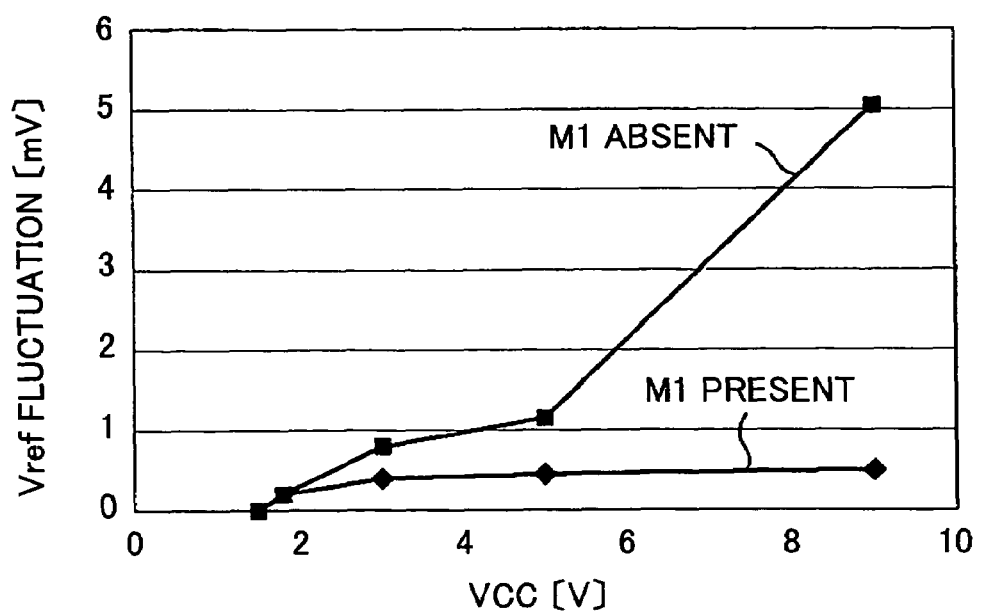
FIG. 14 is a drawing showing experimental data indicting the power-supply-voltage dependency of the reference voltage Vref with respect to the case in which the field-effect transistor M1 is present and the case in which the field-effect transistor M1 is absent.

FIG. 14 is a drawing showing experimental data indicting the power-supply-voltage dependency of the reference voltage Vref in the case in which the field-effect transistor M1 is present and in the case in which the field-effect transistor M1 is absent.

As can be seen from FIG. 14, the voltage fluctuation of the reference voltage Vref in the presence of the field-effect transistor M1 is 0.4 mV, which is less than ¹/₁₀ of the voltage fluctuation of the reference voltage Vref in the absence of the field-effect transistor M1. In this manner, the provision of the field-effect transistor M1 makes it possible to reduce the fluctuation of the reference voltage Vref responding to the fluctuation of the power supply voltage VCC.

Figure 15:
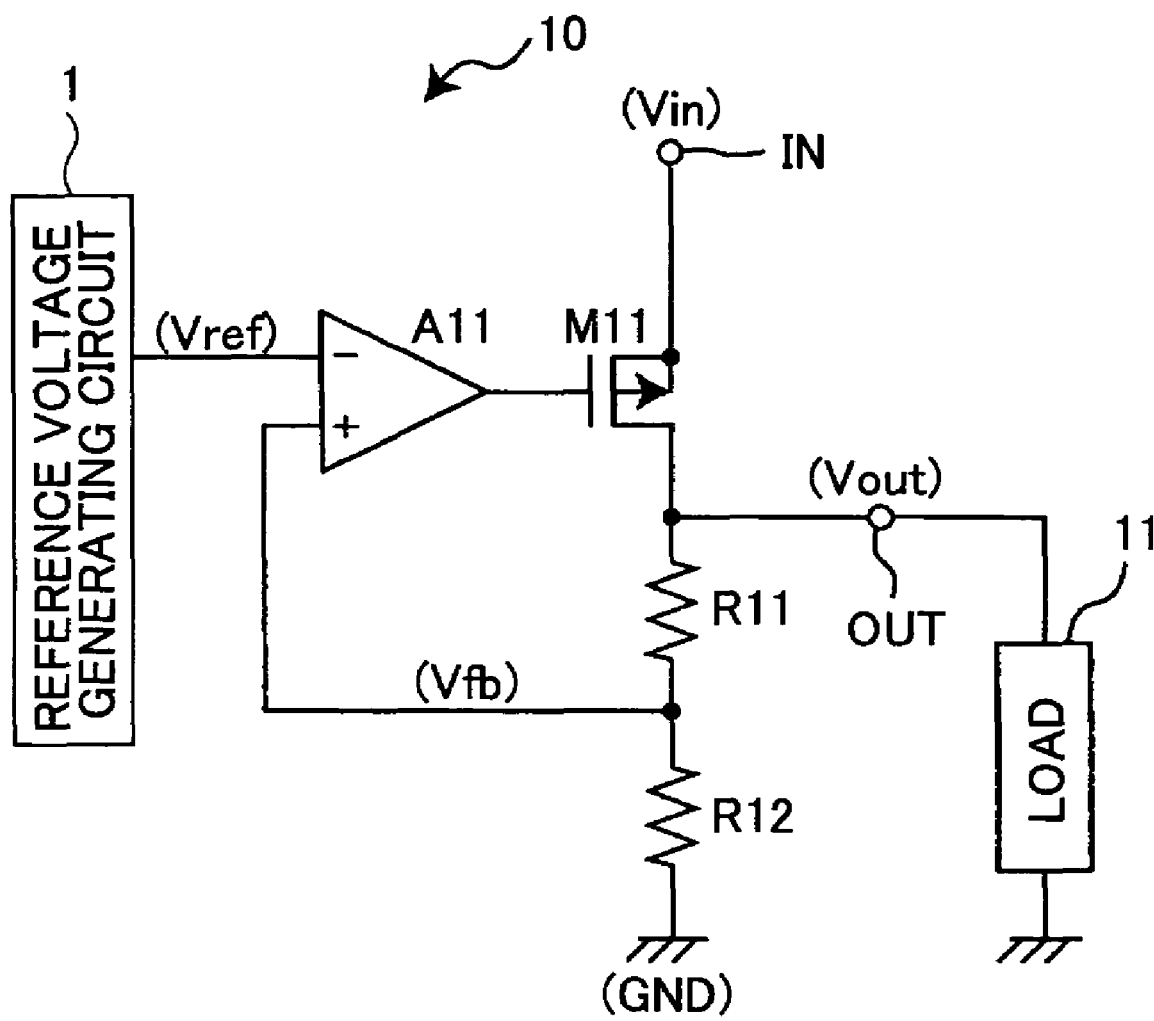
FIG. 15 is a drawing showing an example of a constant voltage circuit using the reference voltage generating circuit of FIG. 1.

FIG. 15 is a drawing showing an example of a constant voltage circuit using the reference voltage generating circuit 1. In FIG. 15, the reference voltage generating circuit 1 is used for a series regulator.

In FIG. 15, a series regulator 10 includes the reference voltage generating circuit 1 for generating and outputting a predetermined reference voltage Vref, an error amplifying circuit A11, an output transistor M11 implemented by use of a PMOS transistor, and resistors R11 and R12 for detecting the output voltage.

The output transistor M1 connects between an input terminal IN and an output terminal OUT, and the resistors R11 and R12 are connected in series between the output terminal OUT and the ground potential GND. The resistors R11 and R12 divide the output voltage out to generate a divided voltage Vfb, which is supplied to the non-inverted input node of the error amplifying circuit A11. The inverted input node of the error amplifying circuit A11 receives the reference voltage Vref. The error amplifying circuit A11 controls the operation of the output transistor M11 such that the divided voltage Vfb becomes equal to the reference voltage Vref. A load 11 is connected between the output node OUT and the ground voltage GND.

Figure 16:
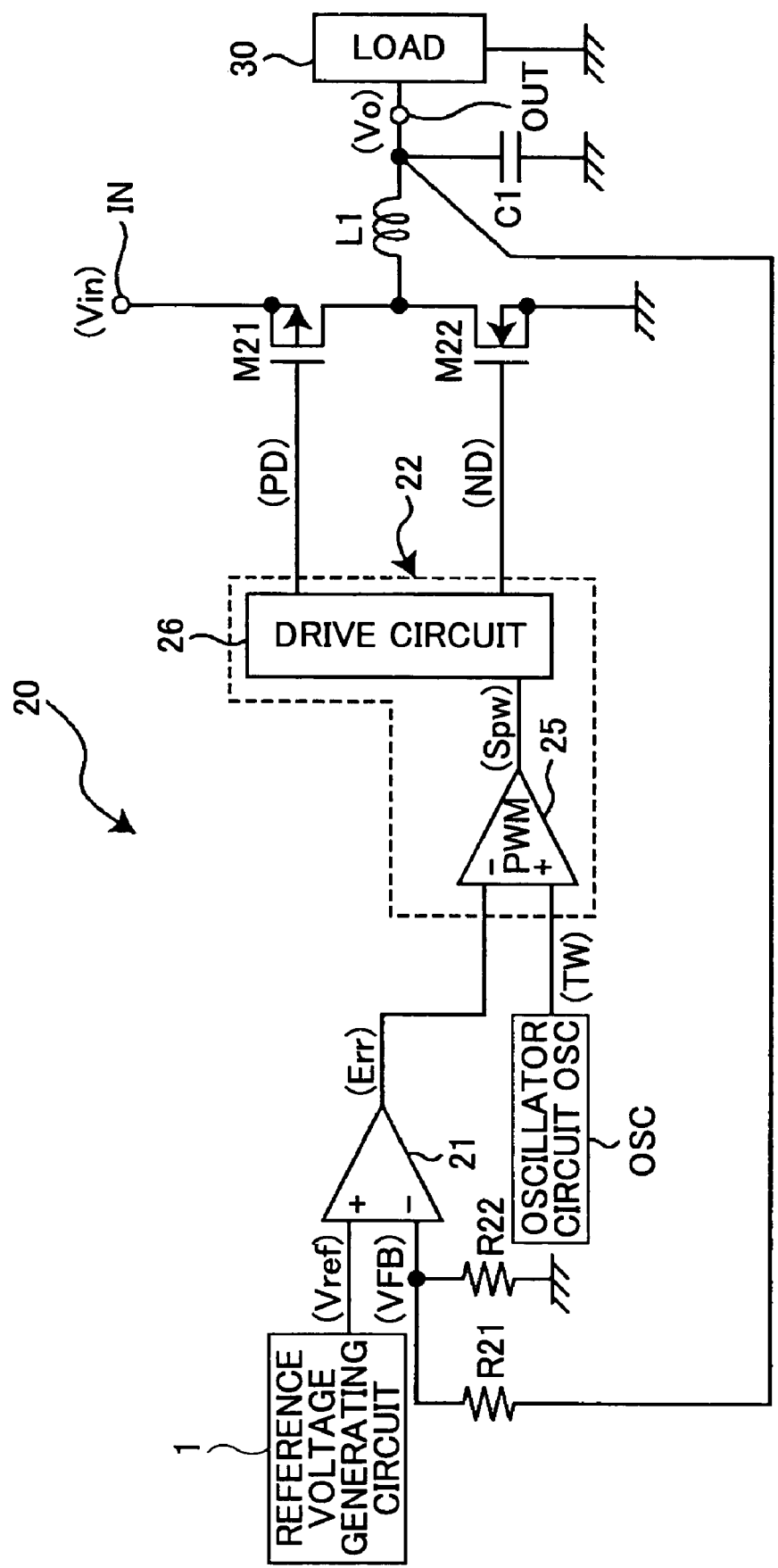
FIG. 16 is a drawing showing another example of a constant voltage circuit using the reference voltage generating circuit of FIG. 1.

FIG. 16 is a drawing showing another example of a constant voltage circuit using the reference voltage generating circuit 1. In FIG. 16, the reference voltage generating circuit 1 is used for a switching regulator.

In FIG. 16, a switching regulator 20 includes a PMOS transistor serving as a first switching element M21 for performing the switching operation to control the outputting of the input voltage Vin, an NMOS transistor serving as a switching element M22 for synchronous rectification, an inductor L1 and condenser C1 constituting a smoothing circuit, and resistors R21 and R22 for dividing the output voltage Vo to generate a divided voltage VFB for output-voltage-detection purposes.

The switching regulator 20 further includes the reference voltage generating circuit 1 for generating and outputting a predetermined reference voltage Vref, an error amplifying circuit 21 for comparing the divided voltage VFB with the reference voltage Vref to produce an output signal Err having a voltage responsive to the results of the comparison, a PWM control circuit 22 for performing the PWM control of the first switching element M21 and synchronous-rectification-purpose switching element M22 so as to control the switching of these elements, and an oscillator circuit OSC for generating a triangular signal TW having a predetermined frequency to be supplied to the PWM control circuit 22.

The PWM control circuit 22 includes a PWM circuit 25 for generating a pulse signal Spw for the PWM control purpose in response to the output signal Err of the error amplifying circuit 21 and the triangular signal TW from the oscillator circuit OSC, and a drive circuit 26 for generating a control signal PD for the switching control of the first switching element M21 and a control signal ND for the switching control of the synchronous-rectification-purpose switching element M22 based on the pulse signal Spw supplied from the PWM circuit 25.

A load 30 is connected between the output node OUT and the ground voltage. The first switching element M21 and the inductor L1 are connected in series between the input node IN and the output node OUT. The synchronous-rectification-purpose switching element M22 is connected between the ground potential and the joint point between the first switching element M21 and the inductor L1. The condenser C1 connects between the output node OUT and the ground potential. A series circuit comprised of the resistor R21 and resistor R22 connects between the output node OUT and the ground voltage.

The joint point between the resistor R21 and the resistor R22 is connected to an inverted input node of the error amplifying circuit 21. The non-inverted input node of the error amplifying circuit 21 receives the reference voltage Vref. The output signal Err of the error amplifying circuit 21 is supplied to the non-inverted input node of the comparator serving as the PWM circuit 25. The triangular signal TW produced by the oscillator circuit OSC is supplied to the non-inverted input node of the comparator serving as the PWM circuit 25. The pulse signal Spw produced by the PWM circuit 25 is supplied to the drive circuit 26. The drive circuit 26 applies the control signal PD for controlling the switching of the first switching element M21 to the gate of the first switching element M21, and applies the control signal ND for controlling the switching of the synchronous-rectification-purpose switching element M22 to the gate of the synchronous-rectification-purpose switching element M22.

With this configuration, the switching regulator 20 operates as a synchronous-rectification-type switching regulator, in which the first switching element M21 performs a switching operation. When the first switching element M21 is turned on, an electric current is supplied to the inductor L1. When this happens, the synchronous-rectification-purpose switching element M22 is in the OFF state. When the first switching element M21 is turned off, the synchronous-rectification-purpose switching element M22 is turned on, so that the energy accumulated in the inductor L1 is released through the synchronous-rectification-purpose switching element M22. The electric current generated at this instance is supplied to the load 30 through the output node OUT while smoothing is performed by the condenser C1.

The output voltage Vo produced at the output node OUT is divided by the resistors R21 and R22 for detecting the output voltage. The divided voltage VFB is supplied to the inverted input node of the error amplifying circuit 21. Since the non-inverted input node of the error amplifying circuit 21 receives the reference voltage Vref, the error amplifying circuit 21 amplifies a voltage difference between the divided voltage VFB and the reference voltage Vref. The amplified voltage difference is then supplied to the inverted input node of the PWM circuit 25. The non-inverted input node of the PWM circuit 25 receives the triangular signal TW from the oscillator circuit OSC. The PWM circuit 25 supplies a PWM-controlled pulse signal Spw to the drive circuit 26.

When the output voltage Vo of the switching regulator 20 increases, the voltage of the output signal Err of the error amplifying circuit 21 drops, so that the duty cycle of the pulse signal Spw from the PWM circuit 25 becomes smaller. As a result, the time length during which the first switching element M21 is in the ON state is shortened, so that the output voltage Vo of the switching regulator 20 drops. As the output voltage Vo of the switching regulator 20 decreases, an operation opposite to what has been described above is performed. As a result, control is performed such that the output voltage Vo of the switching regulator 20 becomes constant.

As described above, the reference voltage generating circuit of the first embodiment has an initial precision that is improved to ±6% from ±30% of the related-art configuration, and has a temperature characteristic that is improved to 40 ppm/° C. from 300 ppm/° C. of the related-art configuration. Further, the fluctuation of the reference voltage Vref responding to power-supply-voltage fluctuation is reduced to less than 1/10 of that of the related-art configuration.

Second Embodiment

In the first embodiment described above, the substrate gate of the field-effect transistor M2 is connected to the source of the field-effect transistor M2. Alternatively, the substrate gate of the field-effect transistor M2 may be connected to the ground voltage GND. Such configuration constitutes a second embodiment of the present invention.

Figure 17:
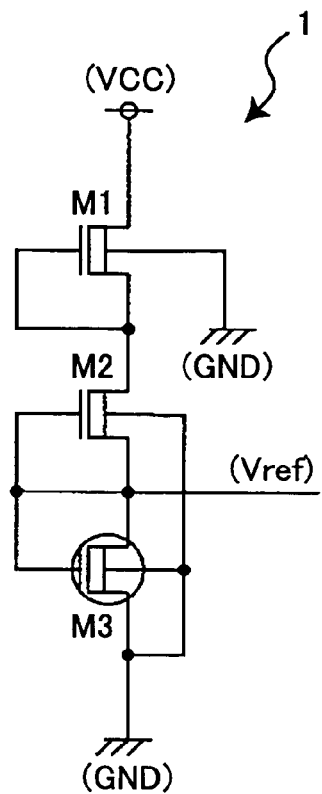
FIG. 17 is a drawing showing an example of a reference voltage generating circuit according to a second embodiment of the present invention.

FIG. 17 is a drawing showing an example of a reference voltage generating circuit according to a second embodiment of the present invention. In FIG. 17, the same elements as those of FIG. 1 are referred to by the same numerals, and a description thereof will be omitted. Differences from the configuration of FIG. 1 will only be described.

The difference from the configuration of FIG. 1 resides in the fact that the substrate gate of the field-effect transistor M2 is connected to the ground voltage GND.

With this configuration, as in the case of the configuration shown in FIG. 1, even if impurity concentrations in the substrate and channel doped regions vary due to process variation, these impurity concentrations vary in the same manner between the field-effect transistor M2 and the field-effect transistor M3. As shown in FIG. 3, the Vgs-id characteristics of the field-effect transistors M2 and M3 exhibit a shift to the right or to the left while maintaining the mutual relationship shown in FIG. 2, so that the absolute value of the reference voltage Vref experiences almost no change. A stable reference voltage Vref can thus be generated.

Since a substrate-bias effect occurs with respect to the field-effect transistor M2, the potential difference of the channel regions ends up having a temperature characteristic (i.e., temperature dependency) slightly more conspicuous than in the case of the first embodiment. However, such temperature characteristic is still smaller than that of the related-art configuration.

As in the first embodiment, the sizes of the field-effect transistors M2 and M3 are adjusted such that both of their temperature characteristics are positive or negative when the drain current of the field-effect transistors M2 and M3 is idM. This makes it possible to set the temperature characteristic of the reference voltage Vref to approximately 40 ppm/° C., which is smaller than the temperature characteristic of the reference voltage Vref of the related-art configuration.

Figure 18:
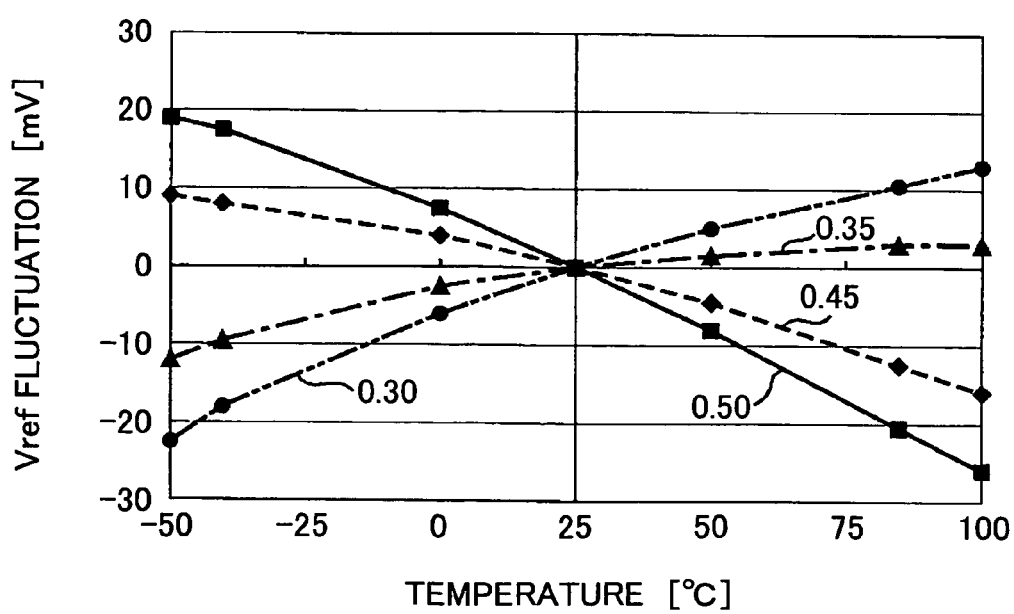
FIG. 18 is a drawing showing experimental data of the temperature characteristic of a reference voltage Vref with respect to various S3/S2 ratios in the reference voltage generating circuit of FIG. 17.

FIG. 18 is a drawing showing experimental data of the temperature characteristic of the reference voltage Vref with respect to various S3/S2 ratios. It can be found from FIG. 18 that a minimum point of the temperature characteristics occurs when the ratio S3/S2 is between 0.35 and 0.45. The optimum ratio S3/S2 that would achieve this minimum point was estimated to be 0.37 through 0.41, and the temperature characteristic in such a case would be approximately 40 ppm/° C. A change in value S3/S2 thus makes it possible to suppress the temperature characteristic of the reference voltage Vref.

As in the first embodiment previously described, the source-drain voltages VdsM2 and VdsM3 of the field-effect transistors M2 and M3 are represented as follows.

$$VdsM2 = Vcc2 - Vref$$

$$VdsM3 = Vref$$

Accordingly, even when the power supply voltage VCC fluctuates, the source-drain voltages of the field-effect transistors M2 and M3 are not affected by such fluctuation, which ensures that the reference voltage Vref does not fluctuate.

The reference voltage generating circuit according to the second embodiment described above can produce the same advantages as do the first embodiment. Further, the reference voltage generating circuit of the second embodiment can be used when the substrate voltage of the field-effect transistor M2 is fixed to the ground voltage GND as in the case in which the field-effect transistors M1 through M3 are formed in a p-type substrate, for example. Further, since all of the substrate voltages of the field-effect transistors M1 through M3 are the ground voltage GND, there is no need to provide a space between the field-effect transistors, which contributes to reduction in the chip area size.

A choice between the first embodiment and the second embodiment may be made on a case-by-case basis by taking into account noise characteristics and the like. As in the first embodiment, the reference voltage generating circuit of the second embodiment may as well be used for a constant voltage circuit as shown in FIG. 15 and FIG. 16.

Further, the present invention is not limited to these embodiments, but various variations and modifications may be made without departing from the scope of the present invention.

The present application is based on Japanese priority application No. 2005-252011 filed on Aug. 31, 2005, with the Japanese Patent Office, the entire contents of which are hereby incorporated by reference.

What is claimed is:

1. A reference voltage generating circuit for producing a predetermined reference voltage at an output node, comprising:

a depletion-type n-channel field-effect transistor serving as a first field-effect transistor having one node thereof coupled to a power supply voltage;

a second field-effect transistor having one node thereof coupled to another node of the first field-effect transistor and having a highly-doped n-type gate; and a third field-effect transistor having one node thereof coupled to another node of the second field-effect transistor, another node thereof coupled to a ground voltage, and a highly-doped p-type gate, wherein a gate of the first field-effect transistor is coupled to a joint point between the first field-effect transistor and the second field-effect transistor, substrate gates of the first and third field-effect transistors coupled to the ground voltage, and the gate and substrate gate of the second field-effect transistor and the gate of the third field-effect transistor coupled to a joint point serving as the output node between the second field-effect transistor and the third field-effect transistor, and wherein each of the second and third field-effect transistors is configured to have such a ratio of a channel width to a channel length that a characteristic indicating a relationship between a gate-source voltage and a drain current exhibit a positive temperature dependency for both of the second and third field-effect transistors or a negative temperature dependency for both of the second and third field-effect transistors.

2. The reference voltage generating circuit as claimed in claim 1, wherein the second field-effect transistor has a ratio S2 of the channel width to the channel length, and the third field-effect transistor has a ratio S3 of the channel width to the channel length, S3 being smaller than S2.

3. The reference voltage generating circuit as claimed in claim 2, wherein each of the second and third field-effect transistors is configured such that S3/S2 is between 0.5 and 0.67.

4. The reference voltage generating circuit as claimed in claim 3, wherein each of the second and third field-effect transistors is configured such that S3/S2 is between 0.54 and 0.58.

5. A constant voltage circuit for generating a predetermined constant voltage from an input voltage by using a predetermined reference voltage generated by a reference voltage generating circuit as a reference, wherein the reference voltage generating circuit includes:

a depletion-type n-channel field-effect transistor serving as a first field-effect transistor having one node thereof coupled to a power supply voltage;

a second field-effect transistor having one node thereof coupled to another node of the first field-effect transistor and having a highly-doped n-type gate; and a third field-effect transistor having one node thereof coupled to another node of the second field-effect transistor, another node thereof coupled to a ground voltage, and a highly-doped p-type gate, wherein a gate of the first field-effect transistor is coupled to a joint point between the first field-effect transistor and the second field-effect transistor, substrate gates of the first and third field-effect transistors coupled to the ground voltage, and the gate and substrate gate of the second field-effect transistor and the gate of the third field-effect transistor coupled to a joint point serving to provide the reference voltage between the second field-effect transistor and the third field-effect transistor, and wherein each of the second and third field-effect transistors is configured to have such a ratio of a channel width to a channel length that a characteristic indicating a relationship between a gate-source voltage and a drain current exhibit a positive temperature dependency for both of the second and third field-effect transistors or a negative temperature dependency for both of the second and third field-effect transistors.

6. The constant voltage circuit as claimed in claim 5, wherein the second field-effect transistor has a ratio S2 of the channel width to the channel length, and the third field-effect transistor has a ratio S3 of the channel width to the channel length, S3 being smaller than S2.

7. The constant voltage circuit as claimed in claim 6, wherein each of the second and third field-effect transistors is configured such that S3/S2 is between 0.5 and 0.67.

8. The constant voltage-circuit as claimed in claim 7, wherein each of the second and third field-effect transistors is configured such that S3/S2 is between 0.54 and 0.58.

* * * * *